(12) United States Patent
Jeon et al.

(10) Patent No.: US 7,936,021 B2
(45) Date of Patent: May 3, 2011

(54) SEMICONDUCTOR DEVICE INCLUDING A FIN FIELD EFFECT TRANSISTOR AND METHOD OF MANUFACTURING THE SAME

(75) Inventors: Chang-Hoon Jeon, Osan-si (KR); Satoru Yamada, Seoul (KR); Sang-Yeon Han, Suwon-si (KR); Jong-Man Park, Yonging-si (KR); Si-Ok Sohn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 488 days.

(21) Appl. No.: 11/976,252

(22) Filed: Oct. 23, 2007

(65) Prior Publication Data
US 2008/0099850 A1      May 1, 2008

(30) Foreign Application Priority Data
Oct. 25, 2006   (KR) .................. 10-2006-0103789

(51) Int. Cl.
*H01L 29/78*   (2006.01)
*H01L 21/336*   (2006.01)
*H01L 27/108*   (2006.01)

(52) U.S. Cl. . 257/365; 257/347; 257/774; 257/E23.145; 257/E29.122; 257/E29.264; 257/E29.267; 257/302

(58) Field of Classification Search ........... 257/E29.027, 257/E29.13, E29.259, E29.267, 365, 327, 257/329, 331, 496, 349, 347, 774, E23.145, 257/E29.122, E29.264
See application file for complete search history.

(56) References Cited

U.S. PATENT DOCUMENTS

| | | | | |
|---|---|---|---|---|
| 5,698,869 A * | 12/1997 | Yoshimi et al. | ............... | 257/192 |
| 5,858,837 A * | 1/1999 | Sakoh et al. | ................ | 438/255 |
| 5,932,911 A * | 8/1999 | Yue et al. | .................... | 257/330 |
| 6,534,827 B2 * | 3/2003 | Shiiki et al. | ................ | 257/336 |
| 6,573,565 B2 * | 6/2003 | Clevenger et al. | ............ | 257/355 |
| 7,683,428 B2 * | 3/2010 | Chidambarrao et al. | ..... | 257/347 |
| 2004/0219725 A1 * | 11/2004 | Furukawa et al. | ........... | 438/197 |
| 2004/0227181 A1 * | 11/2004 | Yeo et al. | ...................... | 257/328 |
| 2006/0006466 A1 * | 1/2006 | Iinuma | ......................... | 257/347 |
| 2006/0060919 A1 * | 3/2006 | Chang | .......................... | 257/347 |
| 2007/0007595 A1 * | 1/2007 | Hirano et al. | ................. | 257/347 |
| 2007/0042583 A1 * | 2/2007 | Jang et al. | .................... | 438/585 |
| 2007/0045750 A1 * | 3/2007 | Liao et al. | .................... | 257/377 |

FOREIGN PATENT DOCUMENTS

| | | |
|---|---|---|
| JP | 2003-298051 | 10/2003 |
| KR | 0532353 | 11/2005 |
| KR | 1020050108916 | 11/2005 |

* cited by examiner

*Primary Examiner* — Matthew E Warren
*Assistant Examiner* — David Spalla
(74) *Attorney, Agent, or Firm* — Harness, Dickey & Pierce, PLC

(57) ABSTRACT

In a fin field effect transistor (Fin FET) and a method of manufacturing the Fin FET, the Fin FET includes an active pattern inside which insulating layer patterns are formed, an isolation layer pattern enclosing a sidewall of the active pattern such that an opening exposing a sidewall of the active pattern located between the insulating layer patterns is formed, a gate electrode formed on the active pattern to fill the opening, impurity regions formed at portions of the active pattern adjacent to sidewalls of the gate electrode, an insulating interlayer covering the active pattern and the gate electrode and contact plugs formed through portions of the insulating interlayer and the active pattern adjacent to the sidewalls of the gate electrode such that the contact plug makes contact with the impurity region.

12 Claims, 15 Drawing Sheets

SEMICONDUCTOR DEVICE INCLUDING A FIN FIELD EFFECT TRANSISTOR AND METHOD OF MANUFACTURING THE SAME

PRIORITY STATEMENT

This U.S. non-provisional patent application claims the benefit of priority under 35 U.S.C. §119 from Korean Patent Application No. 10-2006-00103789 filed on Oct. 25, 2006, in the Korean Intellectual Property Office (KIPO), the disclosure of which is incorporated herein by reference in its entirety.

BACKGROUND

The integration degree of a semiconductor device gradually increases to realize a higher capacity, higher speed and lower power consumption. Thus, various problems may occur that deteriorate transistor characteristics. For example, a short channel effect such as a punch-through, a drain induced barrier lowering, or a sub-threshold swing, may occur when the length of a channel is shortened. In addition, current leakage and parasite capacitance between a junction region and a substrate may increase.

To overcome one or more of the above problems, a three dimensional device has been researched. For example, a dual gate transistor or a fin field effect transistor has been developed.

The fin field effect transistor may be formed using a silicon fin protruding from a substrate. A gate electrode may be formed on the silicon fin. The silicon fin and the gate electrode may extend in a first direction and a second direction, respectively. The second direction may be substantially perpendicular to the first direction. The silicon fin may be located under the gate electrode corresponding to channel region. The gate electrode may cover both sidewalls of the silicon fin. The channel region may be effectively controlled because the channel region is controlled by the gate electrode covering both sidewalls of the silicon fin. In addition, source/drain regions may be formed at portions of the silicon fin adjacent to the channel region. Thus, a punch-through may be reduced between the source/drain regions.

However, the gate induced drain leakage (GIDL) and junction leakage of such a fin field effect transistor may be larger than those of a conventional planar-typed transistor. Thus, when a dynamic random access memory (DRAM) includes a fin field effect transistor, the retention time (i.e., a refresh time) may be reduced due to increases in the GIDL and the junction leakage.

SUMMARY

Various example embodiments may provide a semiconductor device including a fin field effect transistor having a reduced grain induced drain leakage (GIDL), a reduced junction leakage and a high capacity. Example embodiments may also provide a method of manufacturing the semiconductor device including the fin field effect transistor.

In accordance with an example embodiment, a semiconductor device having a fin field effect transistor may include a silicon substrate, an active pattern, an isolation layer pattern, a gate electrode, impurity regions, an insulating layer pattern and contact plugs. The silicon substrate may have a protrusion and the active pattern may be provided on the protrusion of the silicon substrate. The active pattern may be formed from a semiconductor material, for example. The insulating layer patterns may be formed inside the active pattern. The isolation layer pattern may fill the space between the active patterns, such that an upper portion of the active pattern partially may protrude from the isolation layer. An opening exposing a sidewall of the active pattern may be formed at the isolation layer pattern and the gate electrode may be formed on the exposed upper portion of the active pattern to fill up the opening. Impurity regions may be formed at portions of the active pattern adjacent to sidewalls of the gate electrode. An insulating layer may cover the active pattern and the gate electrode. The contact plugs may be formed through portions of the insulating interlayer and active pattern adjacent to sidewalls of the gate electrode. The contact plug may make contact with the impurity region. In an example embodiment, the semiconductor device may further include spacers formed on sidewalls of the gate electrode, the bottom face of the contact plug may extend to an upper face of the insulating layer pattern and the active pattern may include single crystalline silicon. The insulating layer pattern may include a material such as silicon nitride and silicon oxide, for example.

An insulating material substantially the same as that included in the insulating layer pattern, may be deposited on the sidewall of the protrusion of the silicon substrate and a surface of the active pattern. The contact plug may be formed using polysilicon doped with impurities. The contact plug may include a first polysilicon layer making contact with the impurity region used as a source/drain region and a second polysilicon layer formed on the first polysilicon layer. The first and second polysilicon layers may have first and second impurity concentrations, respectively. The second impurity concentration may be substantially larger than the first impurity concentration.

In accordance with an example embodiment, a semiconductor device may include a silicon substrate, an active pattern, an isolation layer pattern, a gate electrode, first and second impurity regions, an insulating interlayer, a first contact plug and a second contact plug. The silicon substrate may include a trench and the active pattern may be provided on the silicon substrate. Insulating layer patterns may be included inside the active pattern. The isolation layer pattern may fill the trench such that an upper portion of the active pattern may partially protrude from the isolation layer pattern. The isolation layer pattern may have an opening exposing a portion of a sidewall of the active pattern located between the insulating layer patterns. The gate electrode may be provided on the exposed upper portion of the active pattern to fill the opening. The first and second impurity regions may be formed at portions of the active pattern adjacent to sidewalls of the gate electrode. The insulating interlayer may cover the active pattern and the gate electrode. The first contact plug may be formed through portions of the insulating interlayer and the active pattern adjacent to the sidewalls of the gate electrode such that the first contact plug makes contact with the first impurity region. The second contact plug may be formed through portions of the insulating interlayer adjacent to the sidewalls of the gate electrode such that the second contact may make contact with the second impurity region.

In accordance with an example embodiment, a method of manufacturing a semiconductor device having a fin field effect transistor may include forming an active pattern including a semiconductor material on a protrusion of a silicon substrate. Insulating layer patterns may be included inside the active pattern. A preliminary isolation layer pattern filling a space between the active patterns may be formed such that an upper portion of the active pattern may be partially protruded from the preliminary isolation layer pattern. The preliminary isolation layer pattern may be etched to form an isolation layer pattern having an opening exposing a sidewall of the active pattern located between the insulating layer patterns. A gate electrode may be formed on the active pattern to fill the opening. Impurity regions may be formed at portions of the active pattern adjacent to the sidewall of the gate electrode. An insulating interlayer covering the active pattern and the gate electrode may also be formed. A contact plug may be formed through portions of the insulating interlayer and the active pattern adjacent to the sidewalls of the gate electrode, such that the contact plug makes contact with the impurity region.

To form the active pattern, a semiconductor structure may be formed on a substantially planar silicon substrate. A sacrificial layer pattern may be included inside the semiconductor structure. Portions of the semiconductor structure, the sacrificial layer pattern and the silicon substrate corresponding to an isolation region may be subsequently etched to form a preliminary active pattern. The sacrificial layer pattern may be removed to form an opening having a substantially tunnel shape. The opening may be filled with an insulating material to form an insulating layer pattern.

To form the semiconductor structure, a sacrificial layer may be formed on a substantially planar silicon substrate. The sacrificial layer including a semiconductor material having an etching selectively with respect to the silicon substrate may also be formed. A first semiconductor layer including single crystalline silicon may be formed on the sacrificial layer. The sacrificial layer and the first semiconductor layer may be etched to form a sacrificial layer pattern and a first semiconductor pattern. A second semiconductor layer may be formed on the first semiconductor pattern to fill the space between the first semiconductor patterns. The sacrificial layer may include silicon germanium, for example.

To form the semiconductor device, a spacer may be further formed on sidewalls of the gate electrode after the gate electrode is formed.

To form the contact plug, a contact hole may be formed through portions of the insulating interlayer and the active pattern adjacent to the sidewalls of the gate electrode. An upper portion of the insulating layer pattern may be exposed through the contact hole. A polysilicon layer doped with impurities may be formed to fill the contact hole. The polysilicon layer may be planarized until an upper face of the insulating interlayer is exposed.

To form the semiconductor device including the fin field effect transistor, a single crystalline silicon pattern may be further formed on a lower sidewall of the contact hole by performing an epitaxial growth process, for example.

To form the polysilicon layer, a first polysilicon layer that does not include impurities may be formed on a sidewall and a bottom face of the contact hole. A second polysilicon layer doped with impurities may be formed on the first polysilicon layer to fill the contact hole.

In accordance with an example embodiment, a method of manufacturing a semiconductor device having a fin field effect transistor may include forming an active pattern including a semiconductor material on a protrusion of a silicon substrate. Insulating layer patterns may be included inside the active pattern. An active pattern including a semiconductor material may be formed on a protrusion of a silicon substrate and insulating layer patterns may be included inside the active pattern. A preliminary isolation layer pattern filling a space between the active patterns may be formed, such that an upper portion of the active pattern may partially protrude from the preliminary isolation layer pattern. The preliminary isolation layer pattern may be etched to form an isolation layer pattern having an opening exposing a sidewall portion of the active pattern located between the insulating layer patterns. A gate electrode may be formed on the active pattern to fill the opening. Impurity regions may be formed at portions of the active pattern adjacent to the both sidewalls of the gate electrode. An insulating interlayer covering the active pattern and the gate electrode may also be formed. A first contact plug may be formed through portions of the insulating interlayer and the active pattern adjacent to a first sidewall of the gate electrode. The first contact plug may make contact with an upper portion of the insulating layer pattern. A second contact plug may be formed through portions of the insulating interlayer adjacent to a second sidewall of the gate electrode opposite to the first sidewall. The second contact plug may make contact with an upper portion of the active pattern.

According to an example embodiment, an area of the contact plug making contact with the impurity region in the fin field effect transistor may increase to decrease a contact resistance. Thus, a relatively small contact resistance may be obtained even though lightly doped polysilicon is used to form the contact plug. In addition, the on-current may increase. Further, a gate induced drain leakage (GIDL) may decrease because a portion of the contact plug is formed by using the lightly doped polysilicon. A junction current may decrease because an insulating layer pattern is provided under the impurity region.

BRIEF DESCRIPTION OF THE DRAWINGS

The above and other advantages of example embodiments will become readily apparent by reference to the following detailed description when considered in conjunction with the accompanying drawings in which.

DESCRIPTION OF EXAMPLE EMBODIMENTS

Figure 1:
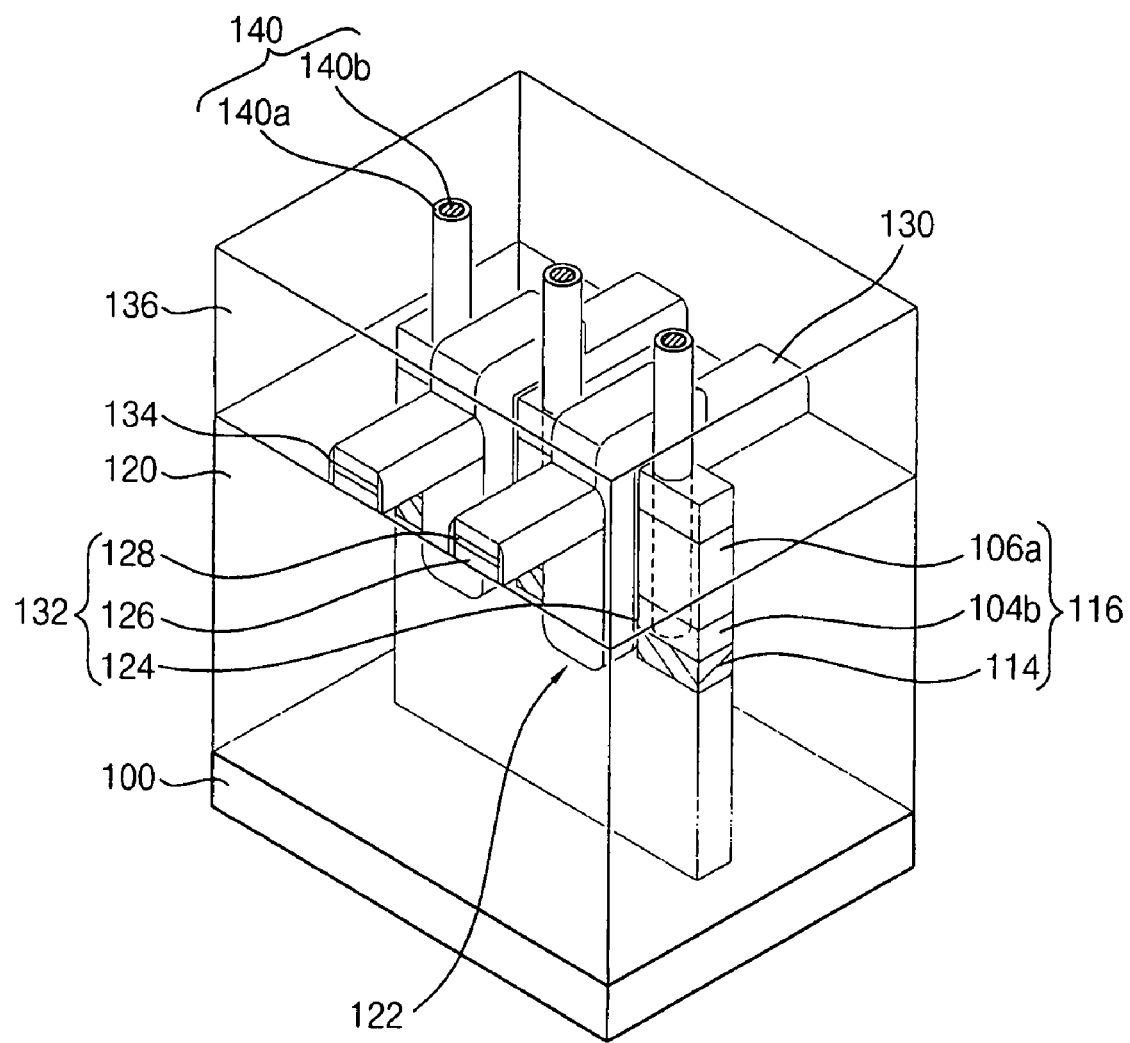
FIG. 1 is a perspective view illustrating a fin field effect transistor (Fin FET) in accordance with an example embodiment.

Example embodiments will now be described more fully hereinafter with reference to the accompanying drawings. Example embodiments, however, may be embodied in different forms and should not be construed as limited to example embodiments set forth herein. Rather, example embodiments are provided so that this disclosure will be thorough and complete, and will fully convey the scope of example embodiments to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of example embodiments.

Spatially relative terms, such as "beneath," "below," "lower," "above," "upper" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit example embodiments. As used herein, the singular terms "a," "an" and "the" are intended to include the plural forms as well, unless the context clearly indicates otherwise. It will be further understood that the terms "includes" and "including" specify the presence of stated features, integers, steps, operations, elements, and/or components, but do not preclude the presence and/or addition of one or more other features, integers, steps, operations, elements, components, and/or groups thereof.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include a fourth member, whereas the expression "at least one selected from the group consisting of A, B, and C" does not.

As used herein, the expression "or" is not an "exclusive or" unless it is used in conjunction with the phrase "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Example embodiments may be described with reference to cross-sectional illustrations, which are schematic illustrations of idealized example embodiments. As such, variations from the shapes of the illustrations, as a result, for example, of manufacturing techniques and/or tolerances, are to be expected. Thus, example embodiments should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of example embodiments. Like reference numerals refer to like elements throughout.

Figure 2:
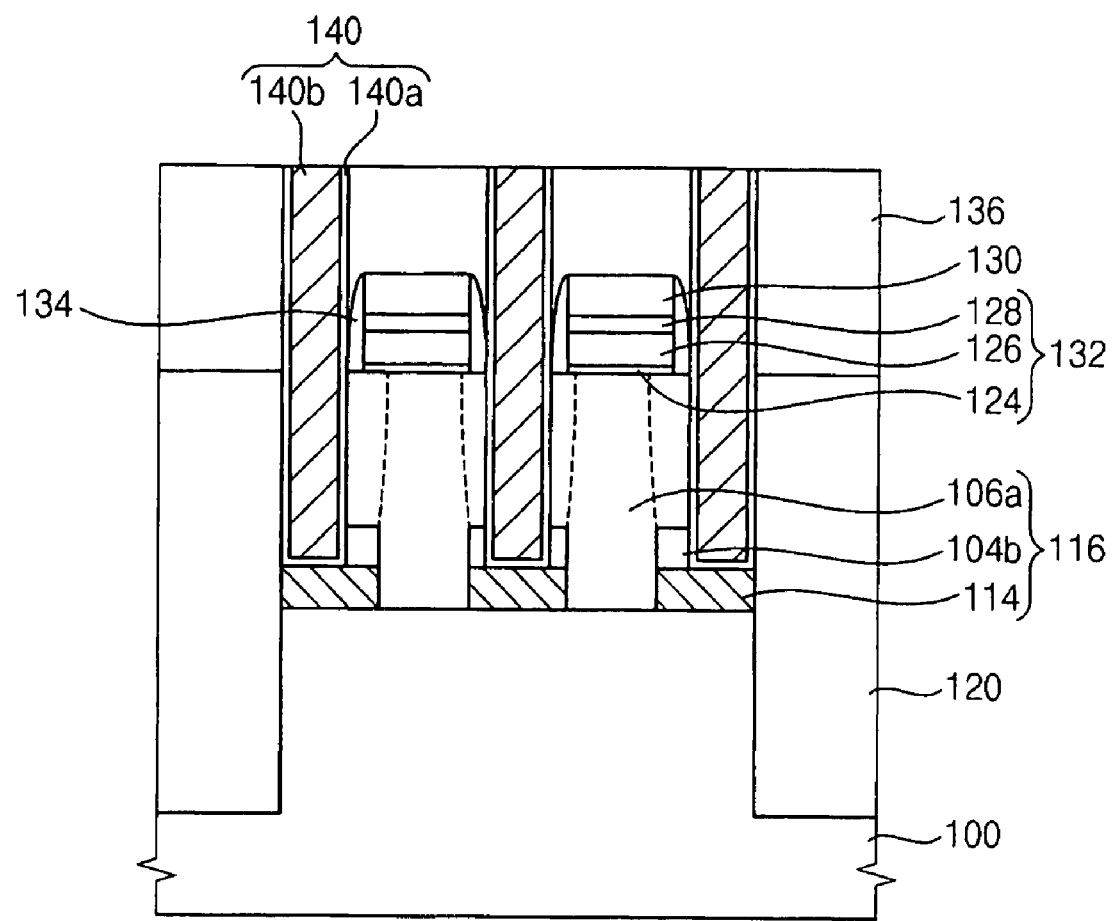
FIG. 2 is a cross-sectional view illustrating the Fin FET in FIG. 1.

FIG. 1 is a perspective view illustrating a fin field effect transistor (Fin FET) in accordance with an example embodiment. FIG. 2 is a cross-sectional view illustrating the Fin FET in FIG. 1.

Referring to FIGS. 1 and 2, a substrate 100 having a protrusion is provided. The substrate 100 may include single crystalline silicon, for example. An active pattern 116 formed using a semiconductor material may be provided on the protrusion of the substrate 100. Insulating layer patterns 114 may be provided inside the active pattern 116.

For example, the active pattern 116 may include an insulating layer pattern 114, a first semiconductor pattern 104b and a second semiconductor pattern 106a. The insulating layer pattern 114 may be formed on the protrusion of the substrate 100. The first semiconductor pattern 104b may be formed on the insulating layer pattern 114. The second semiconductor pattern 106a may cover the insulting layer pattern 114 and the first semiconductor pattern 104b.

The first and second semiconductor patterns 104b and 106a may include single crystalline silicon obtained by an epitaxial growth process, for example. In addition, the insulating layer pattern 114 may be formed using a material such as silicon nitride, silicon oxide, etc. These materials may be used alone or in a combination.

A sidewall of the protrusion of the substrate 100 and a surface of the active pattern 116 may be coated with an insulating material substantially the same as that included in the insulating layer pattern 114.

An isolation layer pattern 120 may be provided to fill a space between the active patterns 116. An upper portion of the active pattern 116 may be partially exposed from the isolation layer pattern 120. An opening 122 exposing a sidewall portion of the active pattern 116 located between the insulating layer patterns 114 may be formed at the isolation layer pattern 120.

The sidewall portion of the active pattern 116 exposed by the opening 122 may be used as an active fin. Thus, a bottom face of the opening 122 may be lower than an upper face of the insulating layer pattern 114 to increase a lateral area of the active fin.

A gate electrode 132 may be provided inside the opening 122 and/or on an exposed active pattern 116. The gate electrode 132 may include a gate oxide layer pattern 124, a polysilicon layer pattern 126 and a tungsten pattern 128 that are subsequently formed. As one alternative, the gate electrode 132 may include polysilicon. As another alternative, the gate electrode 132 may include a polysilicon layer pattern and a tungsten silicide layer pattern that may be subsequently formed. The polysilicon layer pattern 126 may fill the opening 122.

A hard mask pattern 130 may be formed on the gate electrode 132. The hard mask pattern 130 may include silicon nitride. A spacer 134 may be provided on sidewalls of the gate electrode 132 and the hard mask pattern 130.

Impurity regions may be provided at portions of the active pattern 116 located adjacent to both sides of the gate electrode 132. For example, the impurity region may be located under the spacer 134. The impurity region may downwardly extend to the insulating layer pattern 114.

As described above, the impurity region may be provided under the insulating layer pattern 114 so that a junction leakage current may be reduced. An insulating interlayer 136 may be provided to cover the active pattern 116 and the gate electrode 132.

A contact plug 140 may be formed through portions of the insulating interlayer 136 and the active pattern 116 located adjacent to both sides of the gate electrode 132 to be connected to a side portion of the impurity region. The contact plug 140 may make contact with the entire side portion of the impurity region so that the contact area between the contact plug 140 and the impurity region may be relatively large. As a result, contact resistance may decrease so that the on-current may increase.

To increase the contact area between the impurity region and the contact plug 140, the contact plug 140 may extend to an upper face of the insulating layer pattern 114. The contact plug 140 may include polysilicon doped with impurities, for example. When a portion of the contact plug 140 making contact with the impurity region includes a heavily doped polysilicon, a drain induced gate leakage (DIGL) may increase. Thus, the portion of the contact plug 140 making contact with the impurity region may include a lightly doped polysilicon.

However, when the entire contact plug 140 includes a lightly doped polysilicon, the resistance of the contact plug 140 may increase. Thus, the portion of the contact plug 140 that does not directly make contact with the impurity region may include the heavily doped polysilicon.

For example, the contact plug 140 may include a first polysilicon layer pattern 140a having a first impurity concentration and a second polysilicon layer pattern 140b having a second impurity concentration substantially larger than the first impurity concentration. The first polysilicon layer pattern 140a may make contact with the impurity region. The second polysilicon layer pattern 140b may be formed on the first polysilicon layer pattern 140a.

An area of the contact plug making contact with the impurity region in the fin field effect transistor may increase so that a contact resistance may decrease. Thus, a relatively small contact resistance may be obtained although the lightly doped polysilicon may be used to form the contact plug. In addition, an on-current may increase. Further, a gate induced drain leakage (GIDL) may decrease because a portion of the contact plug may be formed by using the lightly doped polysilicon. In addition, a junction current may decrease because an insulating layer pattern is provided under the impurity region.

FIGS. 3 to 14 are perspective views illustrating an example method of manufacturing the fin field effect transistor (Fin FET) in FIGS. 1 and 2 in accordance with an example embodiment.

Figure 3:
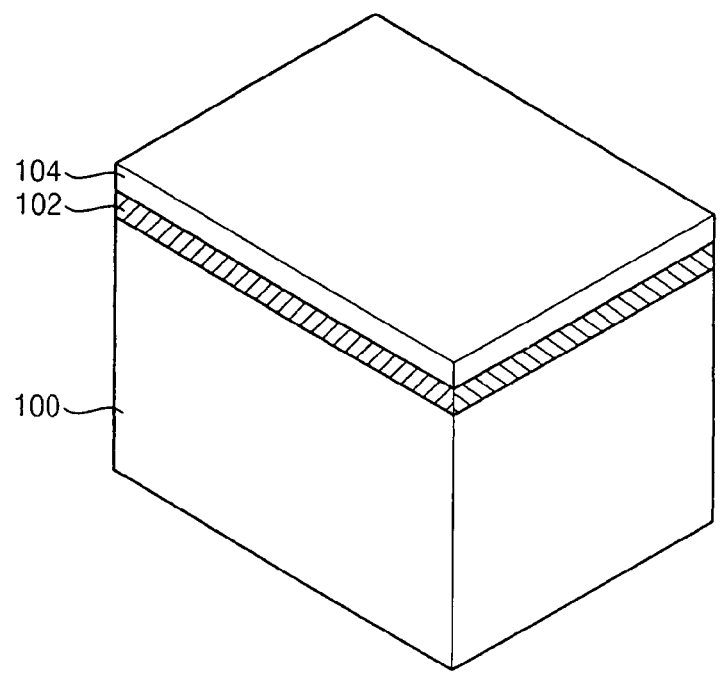
FIGS. 3 to 14 are perspective views illustrating a method of manufacturing a fin field effect transistor (Fin FET) in FIGS. 1 and 2 in accordance with an example embodiment.

Referring to FIG. 3, a sacrificial layer 102 may be formed on a single crystalline silicon substrate 100 having an upper face that is substantially planar, for example. The sacrificial layer 102 may include a semiconductor material having an etching selectivity with respect to the single crystalline silicon substrate 100. The sacrificial layer 102 may include single crystalline silicon germanium obtained by an epitaxial process performed using the single crystalline silicon substrate 100 as a seed, for example.

A first semiconductor layer 104 may be formed on the sacrificial layer 102 by using single crystalline silicon. The first semiconductor layer 102 may be formed by an epitaxial growth process performed using the sacrificial layer 102 as a seed, for example.

Figure 4:
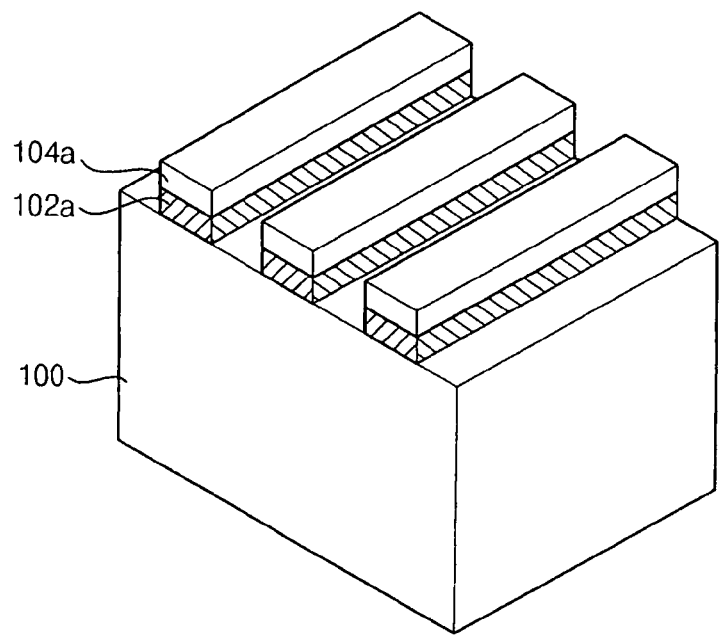

Referring to FIG. 4, the first semiconductor layer 104 and the sacrificial layer 102 may be partially etched by a photolithography process so that a structure including a preliminary sacrificial layer pattern 102a and a preliminary first semiconductor pattern 104a that are subsequently formed may be obtained. The structure may have a substantially linear shape extending in a first direction. The structures may be substantially in parallel with each other. In addition, the single crystalline silicon substrate 100 may be partially exposed between the structures.

Figure 5:
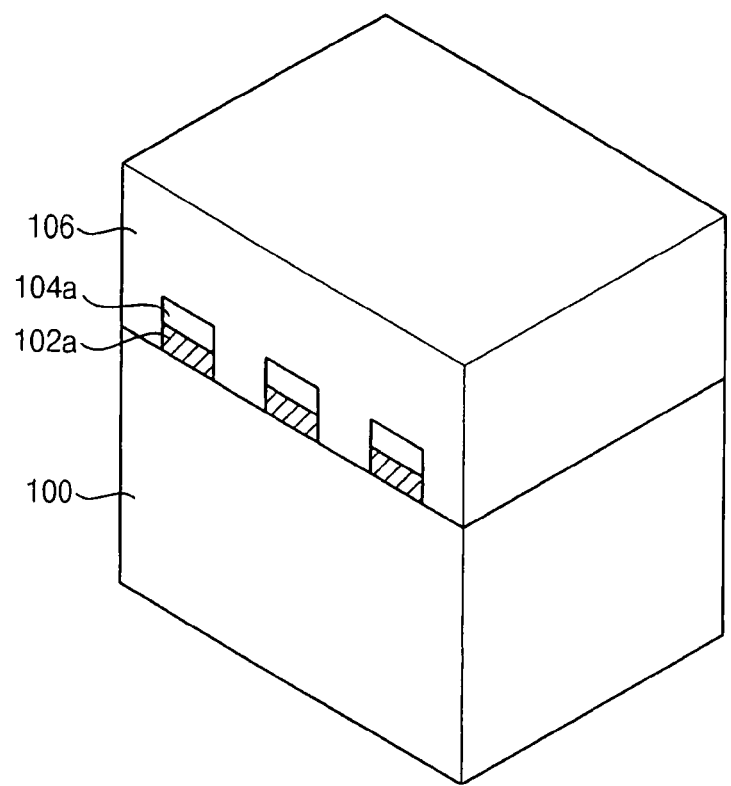

Referring to FIG. 5, a second semiconductor layer 106 filling the space between the structures may be formed to cover the preliminary first semiconductor pattern 104a. The second semiconductor layer 106 may include single crystalline silicon formed by an epitaxial growth process by using the single crystalline silicon substrate 100 and the preliminary first semiconductor pattern 104a as seeds, for example.

A planarization process may be performed on the second semiconductor layer 106 such that an upper face of the second semiconductor layer 106 may become substantially planar. The polarization process may be a chemical mechanical polishing (CMP) process, for example.

Figure 6:
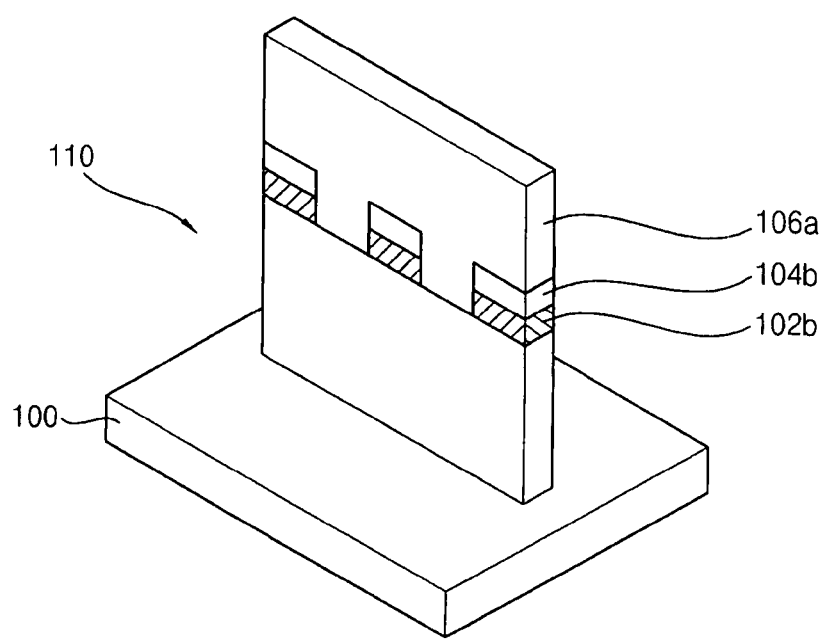

Referring to FIG. 6, a hard mask pattern (not shown) covering an active region may be formed on the second semiconductor layer 106. Portions of the second semiconductor layer 106, the preliminary sacrificial layer pattern 102a, the preliminary first semiconductor pattern 104a and the single crystalline silicon substrate 100 corresponding to an isolation region may be etched using the hard mask pattern as an etch mask so that an isolation trench 110 may be formed.

A portion of the single crystalline silicon substrate 100 corresponding to the active region may have a protruded shape resulting from the above etching processes. The preliminary sacrificial layer pattern 102a and the preliminary first semiconductor pattern 104a may be transformed into a sacrificial layer pattern 102b and a first semiconductor pattern 104b, respectively, that have isolated shapes by the above etching processes. In addition, the second semiconductor layer 106 may be transformed into a second semiconductor pattern 106a by the above etching processes. The second semiconductor pattern 106a may have an isolated shape extending in a second direction that is substantially perpendicular to the first direction.

Figure 7:
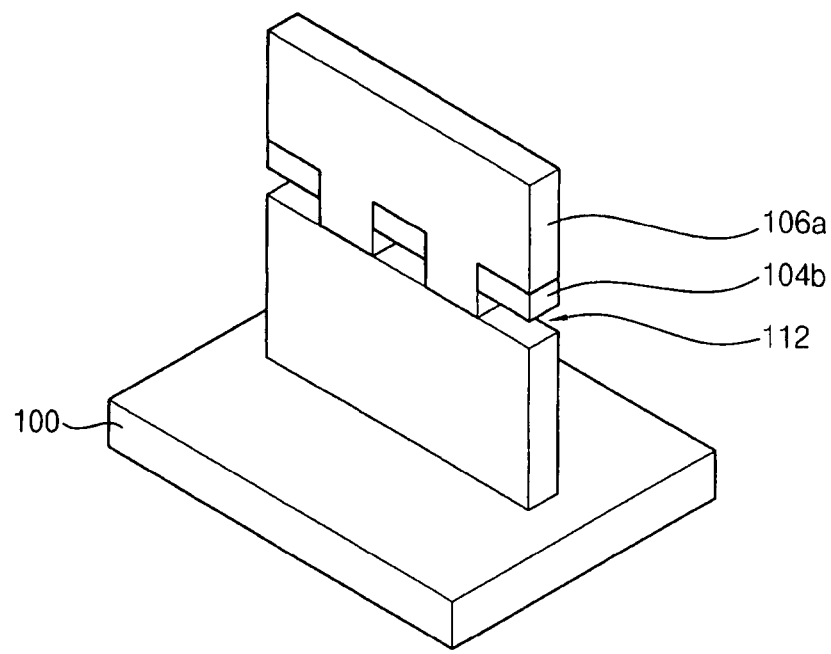

Referring to FIG. 7, the sacrificial layer pattern 102b may be removed by an isotropic etching process, for example. Thus, a first opening 112 having a tunnel shape may be formed in a space from which the sacrificial layer pattern 102b is removed.

Figure 8:
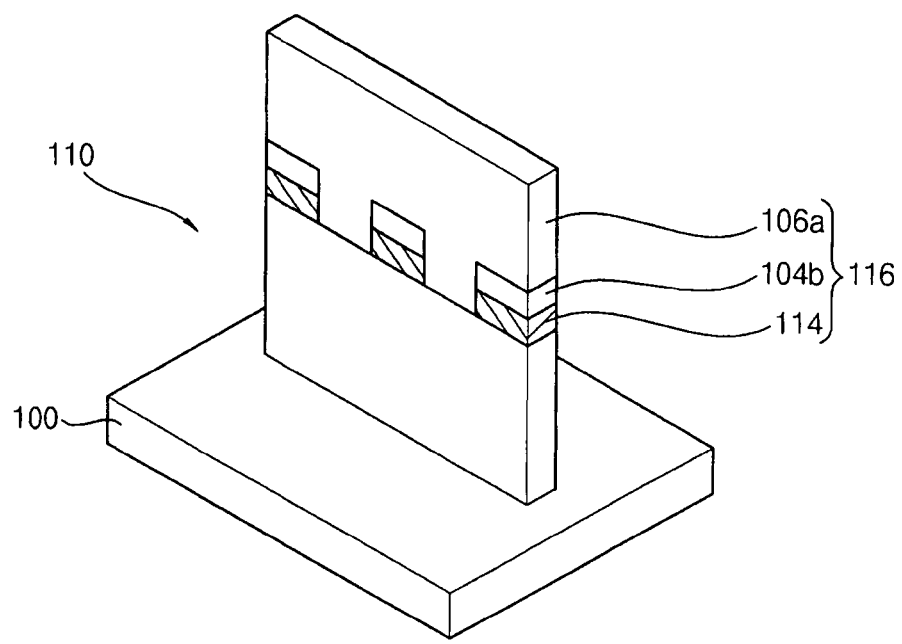

Referring to FIG. 8, the first opening 112 may be filled with an insulating material so that an insulating layer pattern 114 may be formed. When the isolation layer pattern 114 is formed, an insulating layer (not shown) having a relatively uniform thickness may be formed on the second semiconductor pattern 106a, the first semiconductor pattern 104b and the single crystalline silicon substrate 100.

For example, the insulating material may be deposited on the single crystalline silicon substrate 100, the second semiconductor pattern 106a, the first semiconductor pattern 104b, the hard mask pattern (not shown) and an inner face of the first opening 112 to fill the first opening 112. As a result, the insulating layer pattern 114 may be formed inside the first opening 112. The insulating material may be silicon nitride or silicon oxide, for example. These materials may be used alone or in a combination.

For example, a silicon oxide film having a relatively thin thickness may be formed on the inner face of the first opening 112 such that the first opening 112 may be partially filled with the silicon oxide film. Thereafter, a silicon nitride film may be formed to fill the first opening 112. When silicon nitride is directly deposited on single crystalline silicon to form the silicon nitride film, a stress may be generated between silicon nitride and single crystalline silicon. Thus, the silicon oxide film may be employed to reduce the stress. An active pattern 116 inside which an insulating layer pattern is provided may be formed by the above processes.

Figure 9:
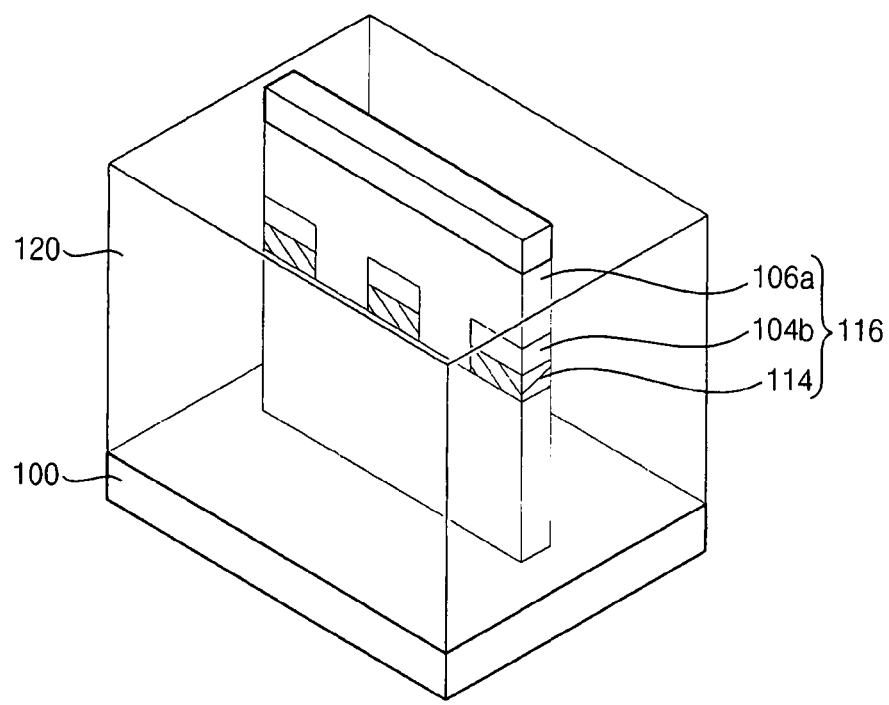

Referring to FIG. 9, an insulating layer (not shown) may be formed to fill the isolation trench 110. The insulating layer may be formed by depositing silicon oxide capable of efficiently filling a gap, for example.

The insulating layer may be planarized until the hard mask pattern (not shown) is exposed. The insulating layer may be partially etched to reduce the thickness of the insulating layer such that an upper sidewall of the second semiconductor pattern 106a may be exposed, to form an isolation layer 120. An upper portion of the active pattern 116 may be partially exposed from the isolation layer 120 after the above processes.

Figure 10:
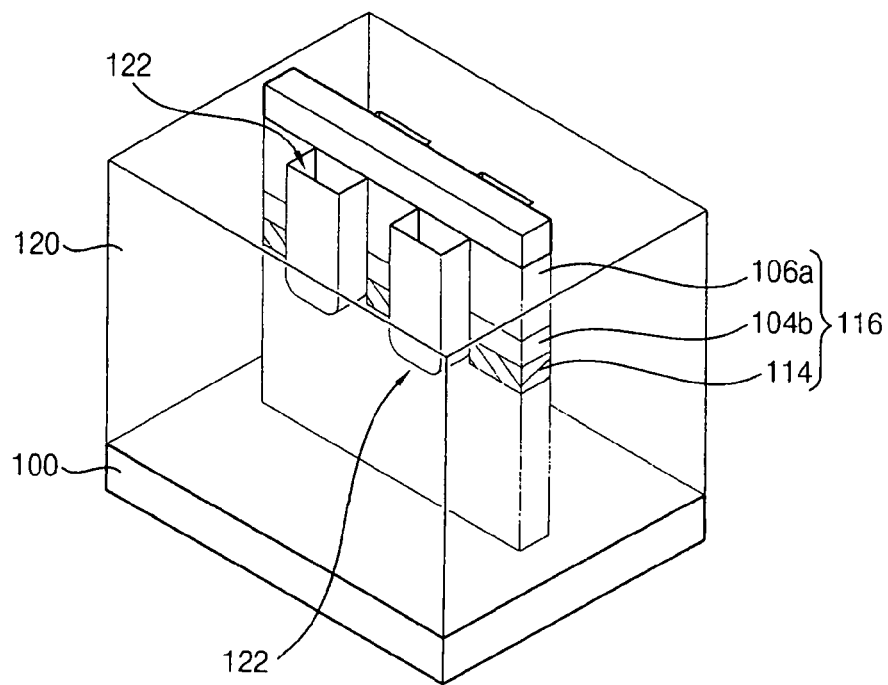

Referring to FIG. 10, the isolation layer 120 may be partially etched such that both sidewalls of the second semiconductor pattern 106a located between the insulating layer patterns 114 may be selectively exposed. Thus, a second opening 122 may be formed.

A sidewall portion of the second semiconductor pattern 106a exposed from the second opening 122 may be used as an active fin. Thus, a bottom face of the second opening 122 may be preferably lower than an upper face of the insulating layer pattern 114 to increase a height of the active fin. The hard mask pattern may then be removed from the second semiconductor pattern 106a.

Figure 11:
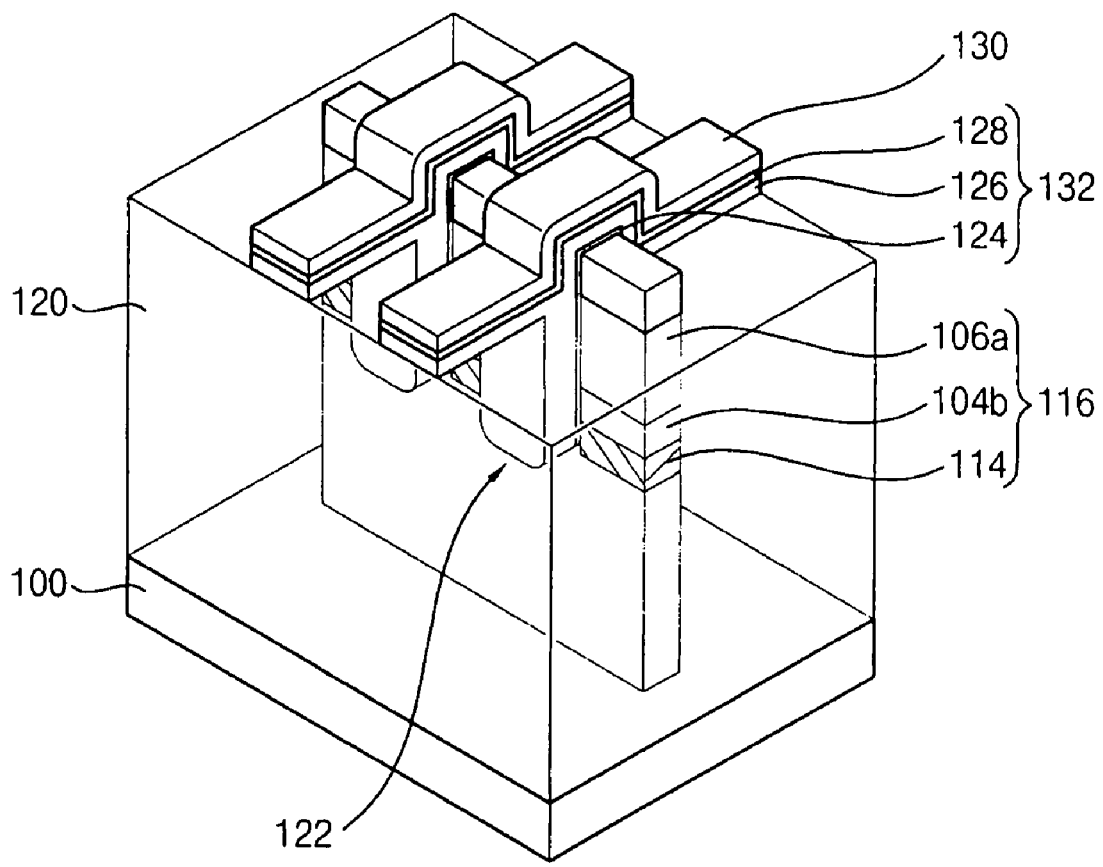

Referring to FIG. 11, an exposed surface of the second semiconductor pattern 106a may be oxidized to form a gate oxide layer pattern 124. A conductive material may be formed on the second semiconductor pattern 106a and the isolation layer 120 to fill the second opening 122 so that a gate electrode layer (not shown) may be formed. The gate electrode layer may be formed using doped polysilicon, for example. In addition, the gate electrode layer may be formed by depositing polysilicon and conductive material having a resistance lower than polysilicon. For example, the conductive material deposited on the polysilicon may be tungsten or tungsten silicide.

A second hard mask pattern 130 may be formed on the gate electrode layer. The second hard mask pattern 130 may be formed using silicon nitride, for example. The second hard mask pattern 130 may have a linear shape extending in the first direction. In addition, the second hard mask pattern 130 may be formed over the second opening 122.

The gate electrode layer may be etched using the second hard mask pattern 130 as an etch mask so that a gate electrode 132 may be formed. The gate electrode 132 may be formed on the exposed second semiconductor pattern 106a and the isolation layer 120 to fill the second opening 122. The gate electrode 132 may include a gate oxide layer pattern 124, a polysilicon pattern 126 and a tungsten pattern 126 that are subsequently formed, for example.

Thus, a channel region of a fin field effect transistor may be formed at a sidewall portion of the second semiconductor pattern 106a exposed by the second opening 122.

Figure 12:
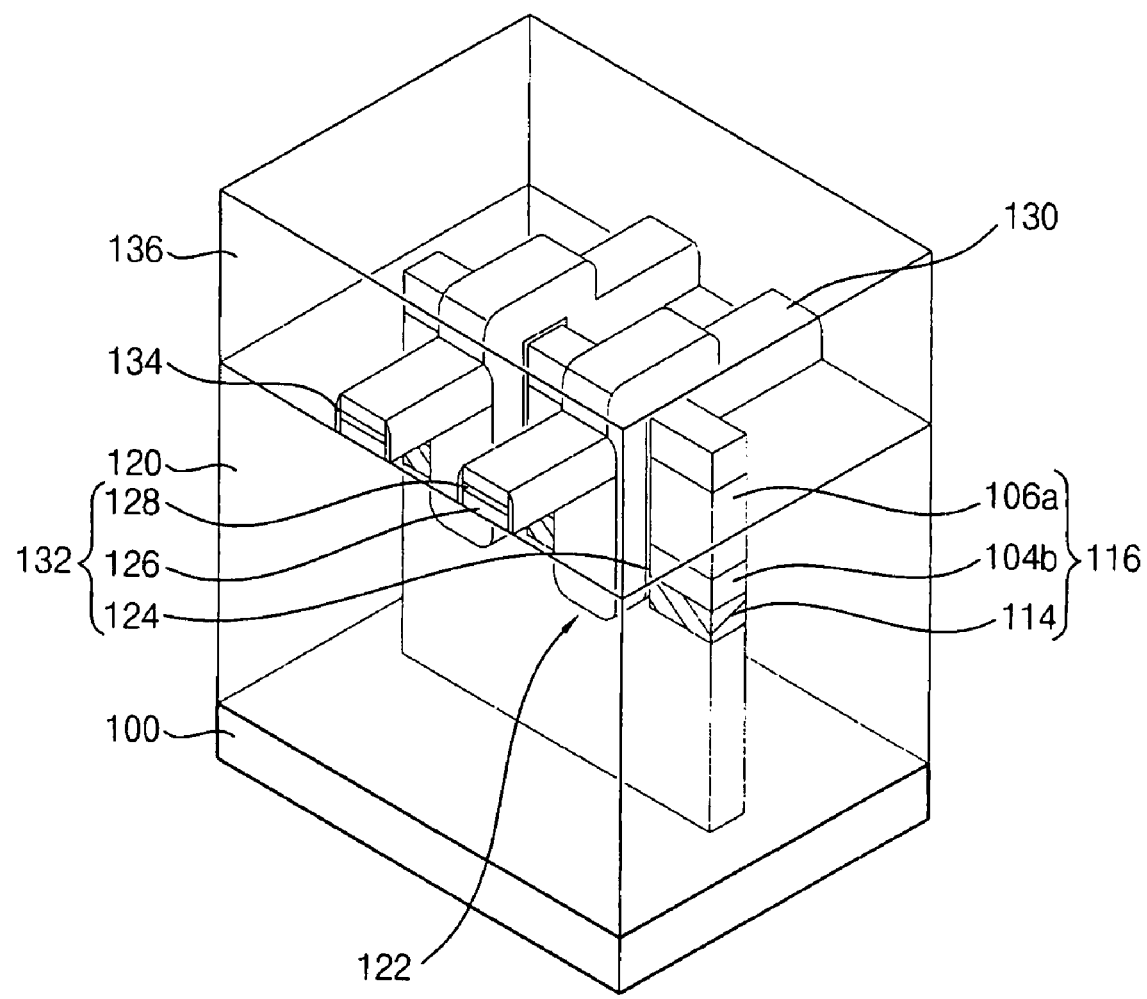

Referring to FIG. 12, spacers 134 may be formed on both sidewalls of the second hard mask pattern 130 and the gate electrode 132. To form the spacers 134, silicon nitride may be deposited, for example. An anisotropic etching process may then be performed.

Impurities may be implanted into the active pattern 116 adjacent to a sidewall of the gate electrode 132 to form an impurity region. The insulating layer pattern 114 may be provided under the impurity region so that a junction current may be reduced.

An insulating interlayer 136 may be formed to cover the gate electrode 132. A planarization process may be performed to planarize an upper face of the insulating interlayer 136. The planarization process may be a chemical mechanical polishing (CMP) process, for example.

Figure 13:
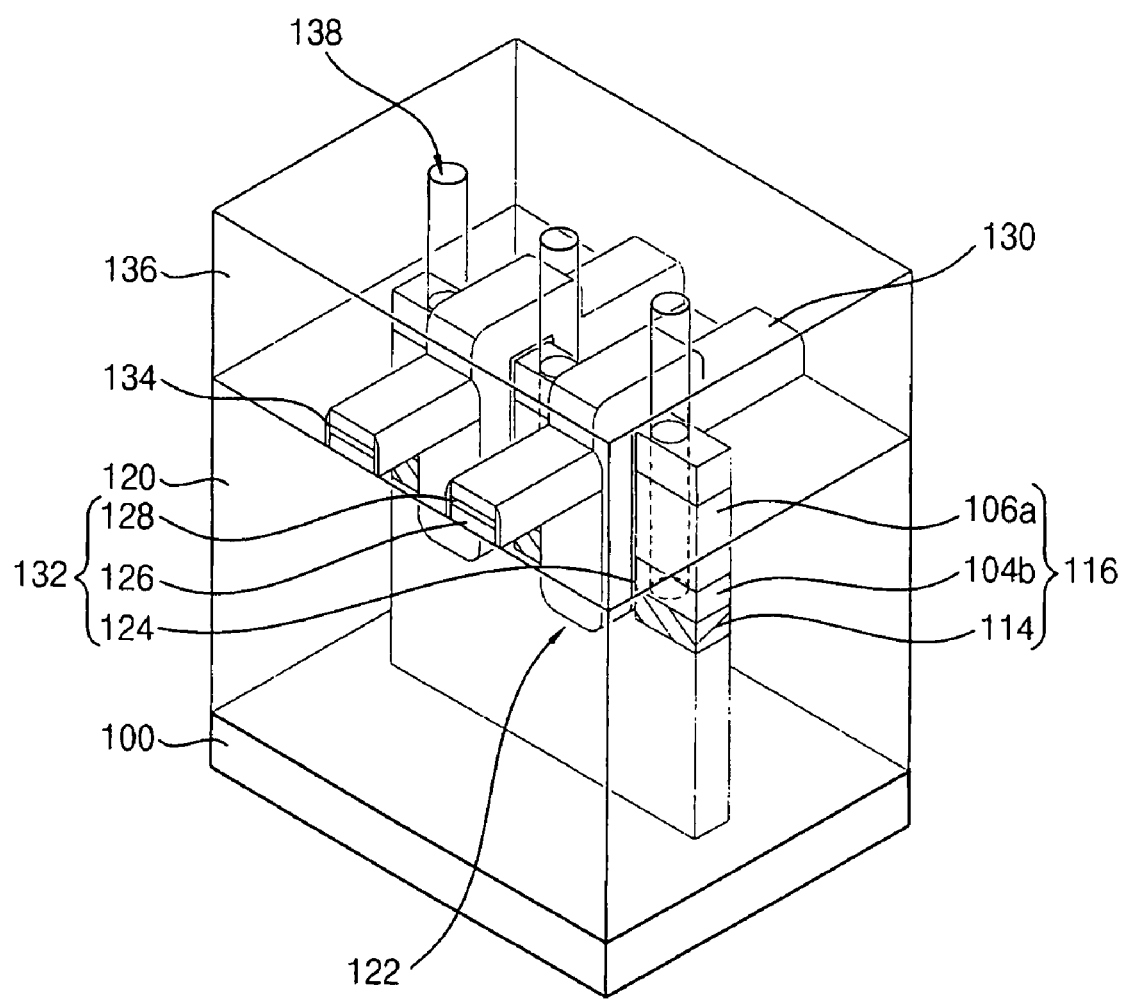

Referring to FIG. 13, the insulating interlayer 136 formed between the gate electrodes 132 may be etched by a photolithography process, for example. The second semiconductor pattern 106a and the first semiconductor pattern 104b located under the insulating interlayer 136 may be etched to from a contact hole 138. The insulating layer pattern 114 may be exposed from a bottom face of the contact hole 138. That is, the insulating layer pattern 114 may be used as an etch stop layer while the contact hole 138 is formed.

Figure 14:
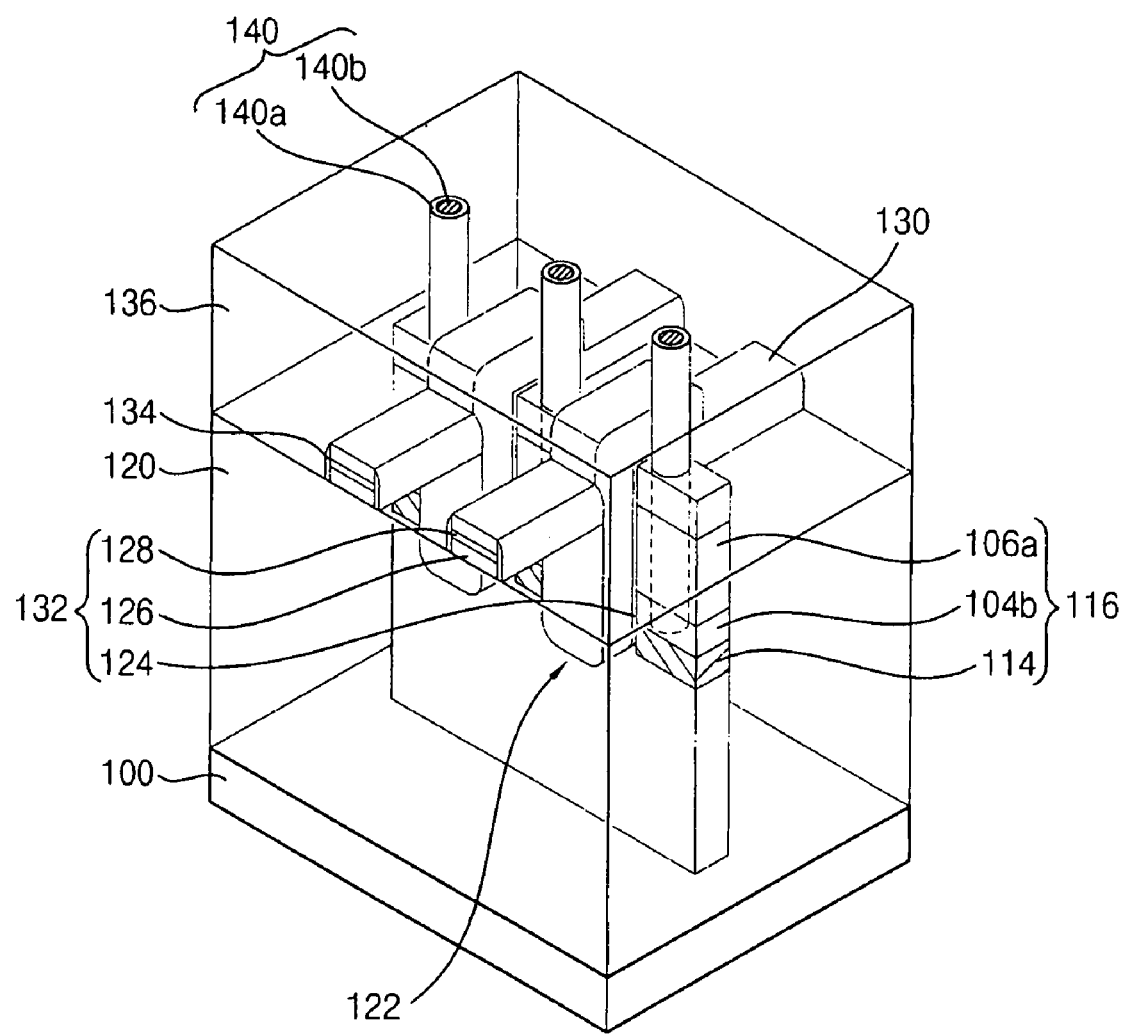

Referring to FIG. 14, a polysilicon layer (not shown) may be formed to fill the contact hole 138. A sidewall portion of the polysilicon layer making contact with the impurity region may have a relatively low impurity concentration.

For example, a first polysilicon that does not include impurities may be deposited on a sidewall of the contact hole, a lower face of the contact hole 138 and an upper face of the insulating interlayer 136. A second polysilicon doped with impurities may then be deposited on the first polysilicon. The first polysilicon may be deposited to partially fill the contact hole 138.

The impurities in the second polysilicon may be diffused into the first polysilicon by subsequent processes. Thus, a first polysilicon layer having a first impurity concentration may be formed on an inner face of the contact hole 138. In addition, a second polysilicon layer having a second impurity concentration substantially larger than the first impurity concentration may be formed.

Upper portions of the first and second polysilicon layers may be planarized until an upper face of the insulating interlayer 136 is exposed. When the above processes are performed, a contact plug 140 (illustrated in FIG. 2) including a first polysilicon layer pattern 140a and a second polysilicon layer 140b that are subsequently formed may be obtained. The first polysilicon layer pattern 140a may make direct contact with the impurity region. The second polysilicon layer 140b may be formed on the first polysilicon layer pattern 140a.

Figure 15:
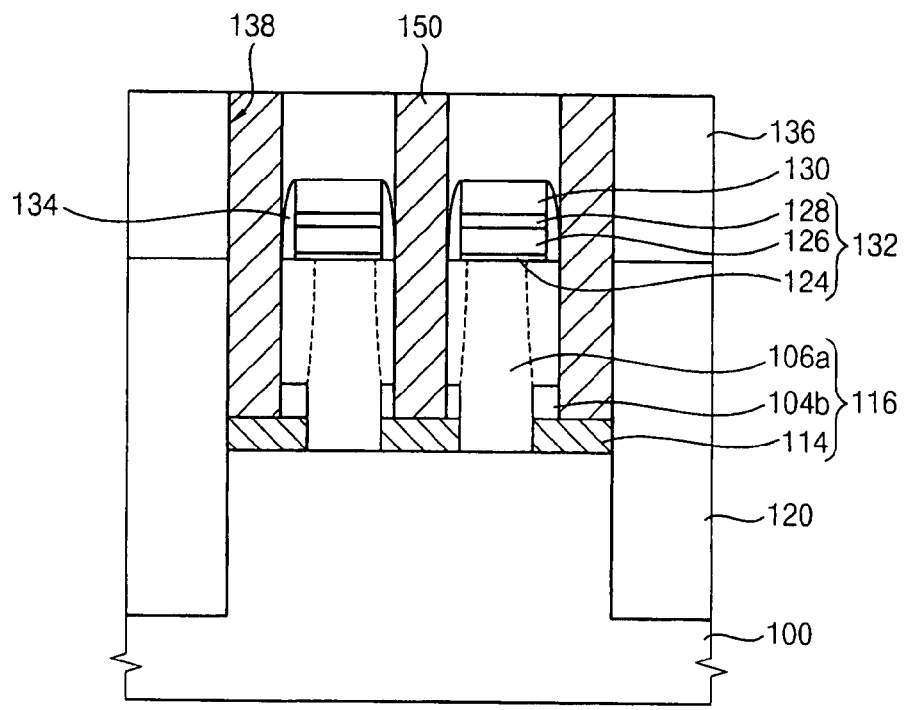
FIG. 15 is a cross sectional view illustrating a method of manufacturing the fin field effect transistor in FIGS. 1 and 2.

FIG. 15 is a cross sectional view illustrating an example embodiment of a method of manufacturing the fin field effect transistor in FIGS. 1 and 2.

Processes that are substantially the same as those in FIGS. 3 to 11 may be performed so that the structure of FIG. 11 may be formed. Spacers 134 may be formed on both sidewalls of the second hard mask pattern and the gate electrode. However, an ion implantation process in FIG. 12 for implanting impurities into first and second semiconductor patterns 104b and 106a exposed adjacently to sidewalls of a gate electrode may not be performed.

After the spacers 134 are formed, an insulating interlayer 136 covering the gate electrode 132 may be formed. A planarization process may be performed to planarize an upper face of the insulating layer 136. The planarizaton process may be a chemical mechanical polishing (CMP) process, for example. A process substantially the same as that illustrated in FIG. 13 may be performed so that a contact hole 138 may be formed through the insulating interlayer 136.

Referring to FIG. 15, a polysilicon layer 150 doped with impurities may be formed to fill the contact hole 138. Here, the polysilicon layer 150 may have a relatively uniform impurity concentration, for example.

A thermal treatment process may be performed after the polysilicon layer 150 having the relatively uniform impurity concentration is formed. Thus, impurities may be diffused into the first and second semiconductor patterns 104b and 106a. That is, an impurity region used as a source/drain region may be formed by the diffusion of impurities. In addition, an impurity concentration of a portion of the polysilicon layer 150 making contact with the contact hole 138 may be reduced by the diffusion of impurities.

Thereafter, as illustrated in FIGS. 1 and 2, an upper portion of the polysilicon layer 150 may be removed such that an upper face of the insulating interlayer 136 may be exposed forming a contact plug 140.

Figure 16:
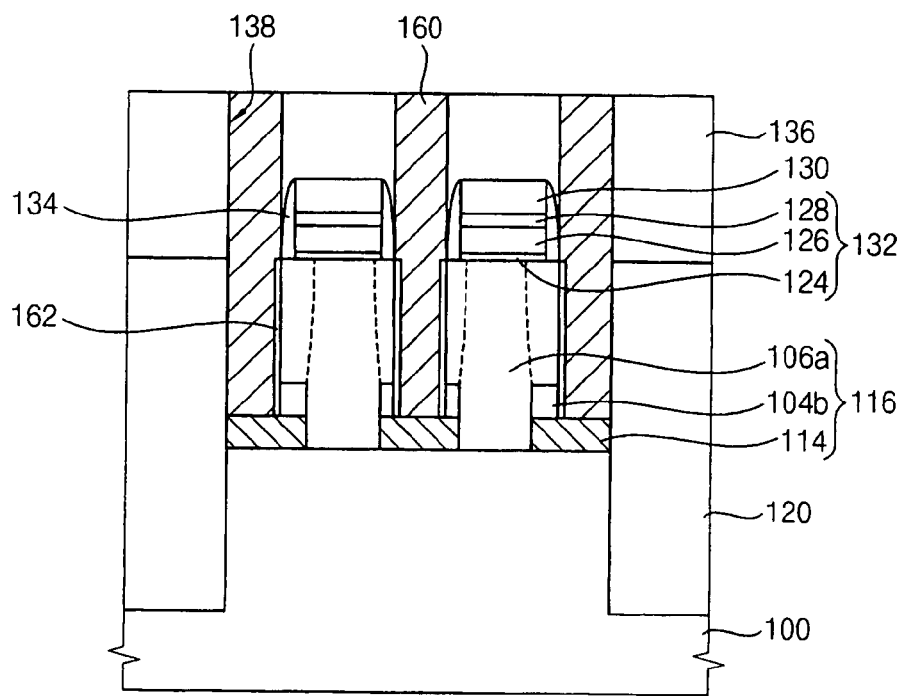
FIG. 16 is a cross-sectional view illustrating a fin field effect transistor in accordance with an example embodiment.

FIG. 16 is a cross-sectional view illustrating a fin field effect transistor in accordance with an example embodiment.

The fin field effect transistor in FIG. 16 is substantially the same as that illustrated in FIGS. 1 and 2 except for a contact plug 160. Thus, any repetitive explanation is omitted. The contact plug 160 may have a lower width substantially smaller than an upper width because of a single crystalline silicon pattern 162 provided on a lower side wall of the contact hole.

Figure 17:
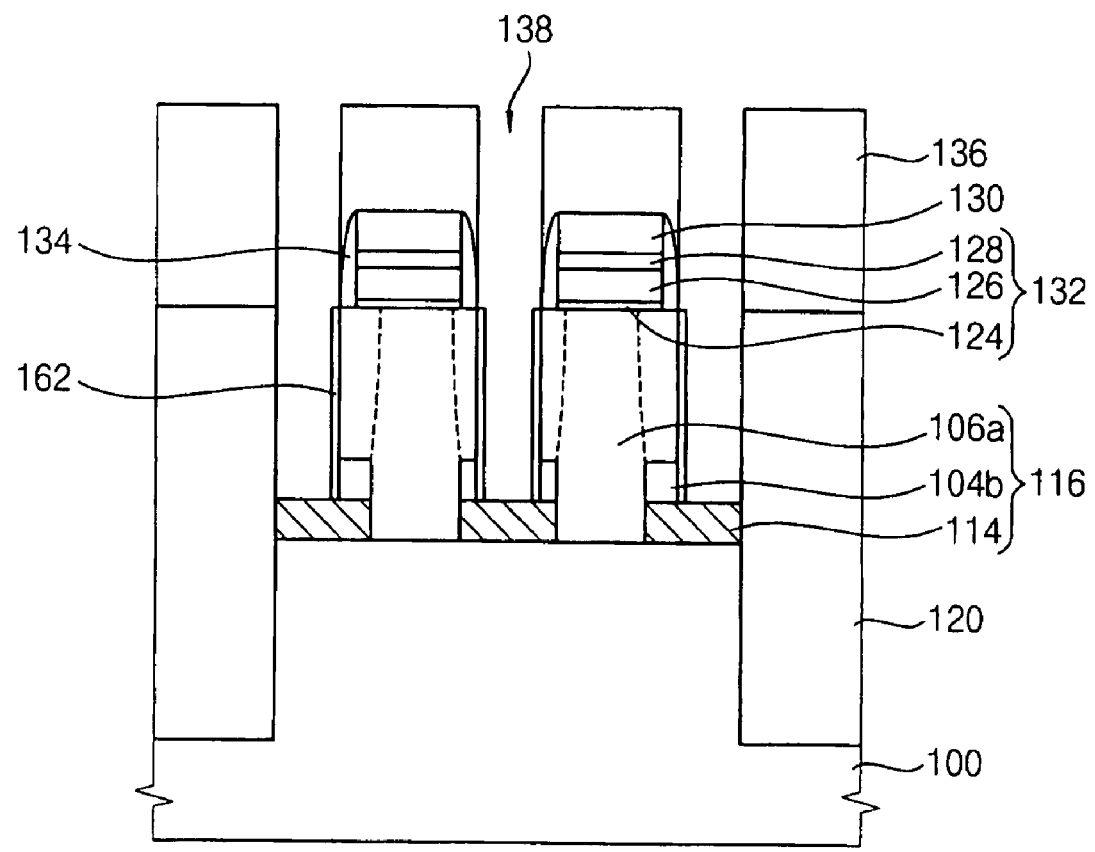
FIG. 17 is a cross-sectional view illustrating a method of manufacturing a fin field effect transistor in FIG. 16.

FIG. 17 is a cross-sectional view illustrating a method of manufacturing a fin field effect transistor in FIG. 16. Processes substantially the same as those illustrated in FIGS. 3 to 13 are performed so that a structure of FIG. 13 may be formed.

Referring to FIG. 17, a single crystalline silicon pattern 162 may be formed on a sidewall of the contact hole 138. The single crystalline silicon pattern 162 may have a relatively thin thickness such that the contact hole 132 may be partially filled with the single crystalline silicon pattern 162.

A selective epitaxial process may be performed using the first and second semiconductor patterns 104b and 106a exposed from sidewalls of the contact hole 138 as a seed to grow single crystalline silicon, for example. Thus, a single crystalline silicon pattern 162 may be formed on the sidewall of the contact hole 138. A lower width of the contact hole 138 may become smaller than an upper width of the contact hole 138 because the single crystalline silicon pattern 162 is formed.

Referring again to FIG. 16, a polysilicon layer having a uniform impurity concentration may be formed to fill the contact hole 138.

Impurities in the polysilicon layer, the first semiconductor pattern and the second semiconductor pattern may be diffused by subsequent annealing processes. The single crystalline silicon pattern 162 may be transformed into an impurity region by the diffusion of the impurities. In addition, an impurity concentration of the polysilicon layer adjacent to the single crystalline silicon pattern 162 may relatively decrease.

An upper portion of the polysilicon layer may be removed so that an upper face of the insulating interlayer 120 may be exposed. Thus, a contact plug 160 may be formed. A lower width of the contact plug 160 may be smaller than an upper width of the contact plug 160 because of the single crystalline silicon pattern 162.

Figure 18:
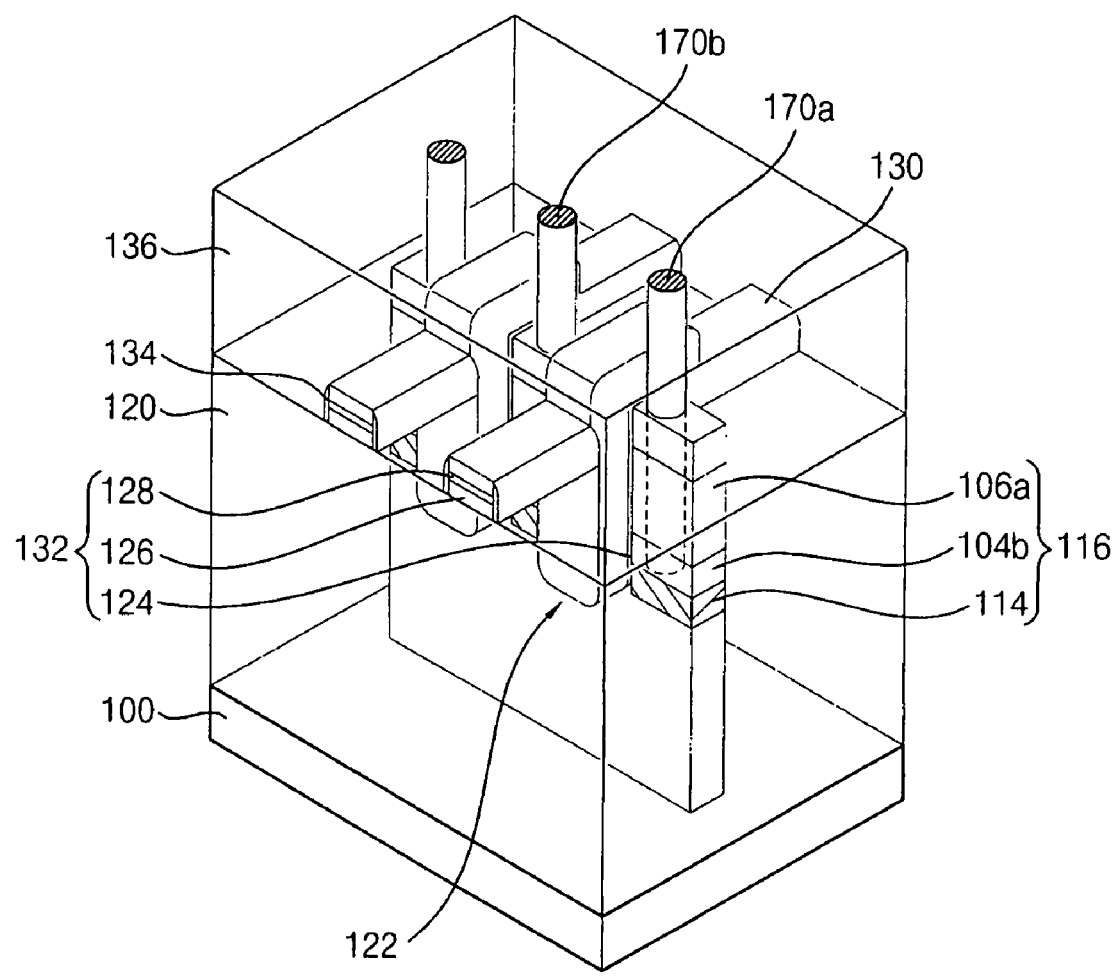
FIG. 18 is a perspective view illustrating a fin field effect transistor in accordance with an example embodiment.
Figure 19:
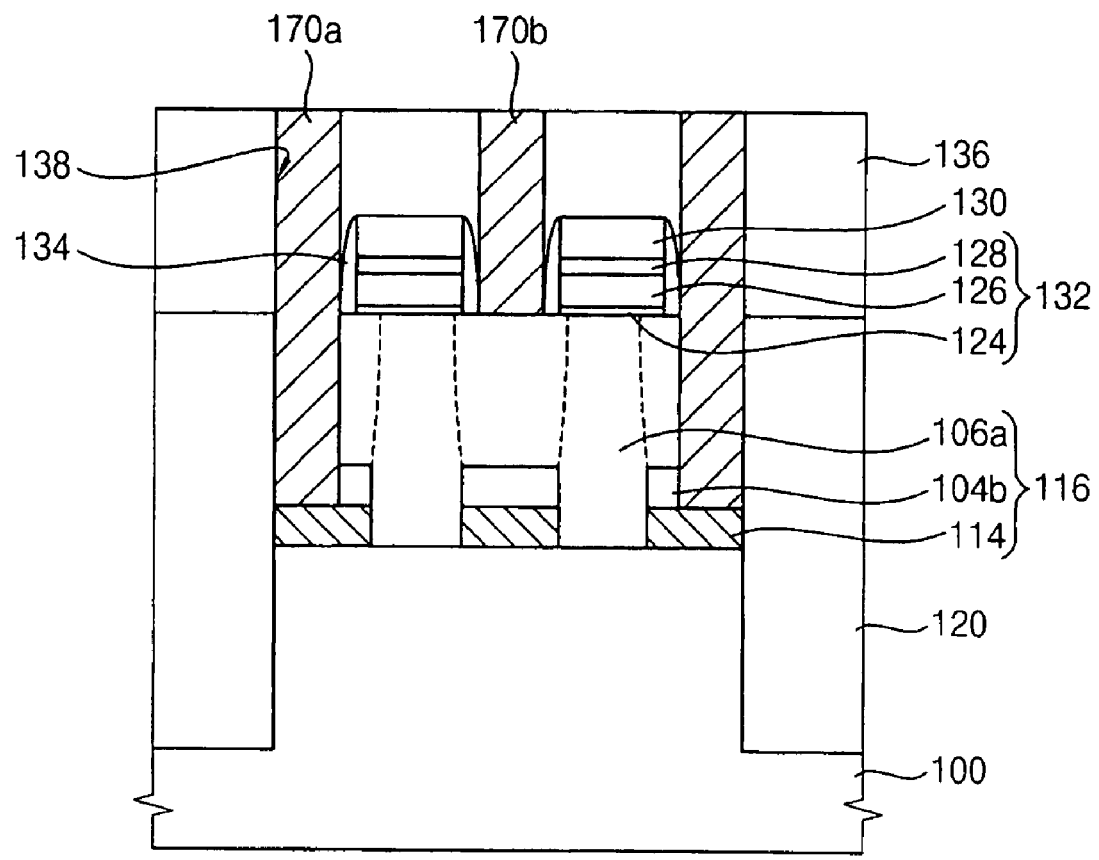
FIG. 19 is a cross-sectional view illustrating the fin field effect transistor in FIG. 18.

FIG. 18 is a perspective view illustrating a fin field effect transistor in accordance with an example embodiment. FIG. 19 is a cross-sectional view illustrating the fin field effect transistor in FIG. 18.

The fin field effect transistor in FIG. 18 may be substantially the same as that illustrated in FIGS. 1 and 2, except for the shape of a contact plug connected to first and second impurity regions.

For example, a first contact plug 170a may be connected to a first impurity region formed under a first sidewall of a gate electrode 132. The first contact plug 170a may be formed through a second semiconductor pattern 106a, a first semiconductor pattern 104b and a single crystalline silicon substrate 100. In addition, the first contact plug may extend to an upper face of the insulating layer pattern 114. Further, a second contact plug 170b making contact with an upper face of the second semiconductor pattern 106a may be connected to a second impurity region formed under a second sidewall of the gate electrode 132.

Figure 20:
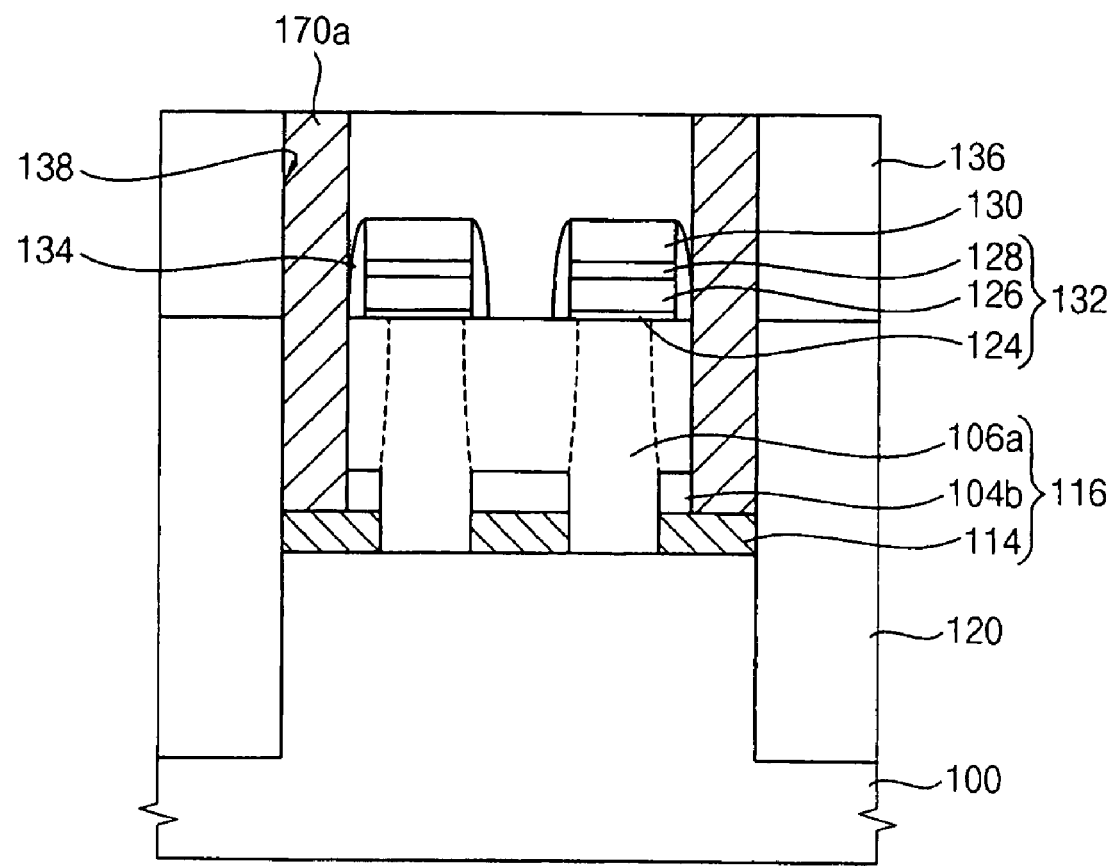
FIG. 20 is a cross-sectional view illustrating a method of manufacturing the fin field effect transistor in FIGS. 18 and 19.

FIG. 20 is a cross-sectional view illustrating an example embodiment of a method of manufacturing the fin field effect transistor in FIGS. 18 and 19. Processes substantially the same as those illustrated in FIGS. 3 to 12 may be performed so that a structure of FIG. 12 may be formed.

Referring to FIG. 20, a portion of an insulating interlayer 136 located between the gate electrode and the isolation layer pattern may be etched by a photolithography process, for example. The second semiconductor pattern 106a and the first semiconductor pattern 104b located under the insulating interlayer 136 may be subsequently etched so that a first contact hole may be formed. The insulating layer pattern 114 may be exposed from a lower face of the first contact hole. That is, the insulating layer pattern 114 may be used as an etch stop layer when the first contact hole is formed.

A polysilicon layer doped with impurities may be formed to fill the first contact hole. A planarization process may be performed to form a first contact plug 170a. A portion of the insulating interlayer 136 located between the gate electrodes may be etched by a photolithography process, for example, so that a second contact hole through which an upper face of the second semiconductor pattern 106a is exposed may be formed.

A polysilicon layer doped with impurities may be formed to fill the second contact hole. A planarization process may be performed so that a second contact plug 170b in FIGS. 18 and 19 may be formed.

Hereinafter, relative relations of a concentration of impurities doped into a contact plug, a gate induced drain leakage (GIDL) and an on-current are described.

Comparative Example 1

A semiconductor device of Comparative Example 1 included a conventional fin field effect transistor, e.g., an insulating layer pattern was not provided inside an active fin. In addition, a contact plug in the semiconductor device included polysilicon having an impurity concentration of about 1E+20/cm3.

Comparative Example 2

A semiconductor device of Comparative Example 2 included a fin field effect transistor formed using an active fin formed from a semiconductor material. Insulating layer patterns were included inside the active fin. However, unlike some example embodiments, the contact plug made contact with an upper face of the second semiconductor pattern. In addition, the contact plug was formed from polysilicon having an impurity concentration of about 1E+20/cm3.

Comparative Example 3

A semiconductor device of Comparative Example 3 had substantially the same shape as the semiconductor device of Comparative Example 2. However, the contact plug included in the semiconductor device of Comparative Example 3 was formed from polysilicon having an impurity concentration of about 5E+19/cm3.

Example 1

A semiconductor device of Example 1 was manufactured by processes illustrated in FIGS. 3 to 14. To form a contact plug of the semiconductor device of Example 1, polysilicon that was not doped with impurities was deposited. Thereafter, polysilicon having an impurity concentration of about 1E+20/cm3 was deposited.

Example 2

A semiconductor device of Example 2 was manufactured by processes illustrated in FIG. 15. A contact plug included in the semiconductor device of Example 2 was formed by depositing polysilicon having an impurity concentration of about 1E+19/cm3.

Off-currents, on-currents and gate induced drain leakages (GIDL) were measured from the semiconductor devices of Comparative Example 1, Comparative Example 2, Comparative Example 3, Example 1 and Example 2. The results are shown in Table 1.

TABLE 1

|  | Ioff(fA) | Ion(µA) | GIDL(fA) |
| --- | --- | --- | --- |
| Comparative Example 1 | 0.2 | 17.5 | 70.9 |
| Comparative Example 2 | 0.2 | 16.1 | 47.3 |
| Comparative Example 3 | 0.0 | 16.6 | 6.2 |
| Example 1 | 0.2 | 21.1 | 0.3 |
| Example 2 | 0.2 | 18.8 | 1.8 |

Referring to Table 1, a GIDL measured from a fin field effect transistor of Comparative Example 2 may be lower than that measured from a fin field effect transistor of Comparative Example 1. However, the difference between the GIDL may be slight.

In addition, comparing Comparative Example 2 with Comparative 3, when an impurity concentration of the contact plug is reduced, the GIDL may largely decrease. However, when an impurity concentration of polysilicon used to form the contact plug decreases like comparative Example 3, a contact resistance increases. Thus, an on-current may decrease.

The gate induced drain leakages of Example 1 and Example 2 are largely lower than those of Comparative Example 1 to Comparative Example 3. In addition, the contact resistance decreases although the impurity concentration of polysilicon used to form the contact plug is lower. Thus, the on-current may largely decrease.

As a result, the fin field effect transistors in the semiconductor devices of Example 1 and 2 may have electric characteristics superior to those of the conventional fin field effect transistor.

As described above, the semiconductor device including the fin field effect transistor may have a reduced contact resistance and a grain induced drain leakage. In addition, the semiconductor device may be formed by relatively simple processes.

The foregoing is illustrative of example embodiments and is not to be construed as limiting thereof. Although a few example embodiments have been described, those skilled in the art will readily appreciate that many modifications are possible without materially departing from the novel teachings and advantages described herein. Accordingly, all such modifications are intended to be included within the scope of example embodiments as defined in the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A fin field effect transistor (Fin FET), comprising:
a silicon substrate having a protrusion;
active patterns on the protrusion of the silicon substrate, the active patterns including insulating layer patterns on an inside of the active patterns;
an isolation layer pattern in a space between the active patterns, the isolation layer pattern including an opening exposing a sidewall of the active pattern, an upper portion of the active patterns protruding from the isolation layer pattern;
a gate electrode on the protruding upper portion of the active patterns that fills the opening;
impurity regions at portions of the active pattern adjacent to sidewalls of the gate electrode;
an insulating interlayer covering the active pattern and the gate electrode; and
at least one contact plug that passes through portions of the insulating interlayer and the active pattern adjacent to the sidewalls of the gate electrode, the at least one contact plug being in contact with the impurity regions.

2. The Fin FET of claim 1, further comprising a spacer on a sidewall of the gate electrode.

3. The Fin FET of claim 1, wherein a bottom face of the contact plug extends to an upper face of the insulating layer pattern.

4. The Fin FET of claim 1, wherein the active pattern includes single crystalline silicon.

5. The Fin FET of claim 1, wherein the insulating layer pattern includes a material selected from the group consisting of silicon nitride and silicon oxide.

6. The Fin FET of claim 1, further comprising an insulating material on a sidewall of the protrusion of the silicon substrate and a surface of the active pattern that is substantially the same as that included in the insulating layer pattern.

7. The Fin FET of claim 1, wherein the at least one contact plug includes polysilicon doped with impurities.

8. The Fin FET of claim 7, wherein the at least one contact plug includes a first polysilicon layer in contact with the impurity region used as a source/drain region and a second polysilicon layer on the first polysilicon layer, the first and second polysilicon layers having first and second impurity concentrations, respectively, the second impurity concentration being substantially larger than the first impurity concentration.

9. The Fin FET of claim 1, wherein the silicon substrate includes a trench and the trench is filled with the isolation layer.

10. The Fin FET of claim 1, wherein the at least one contact plug includes a first contact plug formed through portions of the insulating layer and the active pattern adjacent to the sidewalls of the gate electrode such that the first contact plug is in contact with the first impurity region, and a second contact plug formed through portions of the insulating layer adjacent to the sidewalls of the gate electrode such that the second contact plug is in contact with the first impurity region.

11. A semiconductor device comprising the Fin FET of claim 1.

12. A fin field effect transistor (Fin FET), comprising:
a silicon substrate having a protrusion;
active patterns on the protrusion of the silicon substrate, the active patterns including insulating layer patterns therein, a top surface of the active patterns being at least substantially planar;
an isolation layer pattern in a space between the active patterns, the isolation layer pattern including an opening exposing a sidewall of the active pattern, an upper portion of the active patterns protruding from the isolation layer pattern;
a gate electrode on the protruding upper portion of the active patterns, the gate electrode filling the opening, the gate electrode on sidewalls of the active pattern;
impurity regions at portions of the active pattern adjacent to sidewalls of the gate electrode;
an insulating interlayer covering the active pattern and the gate electrode; and
at least one contact plug that passes through portions of the insulating interlayer and the active pattern adjacent to the sidewalls of the gate electrode, the active pattern surrounding a portion of the contact plug passing through the active pattern, the at least one contact plug being in contact with the impurity regions.

\* \* \* \* \*